United States Patent
Yanagimachi et al.

(10) Patent No.: US 8,441,623 B2
(45) Date of Patent: May 14, 2013

(54) METHOD FOR DETECTING THE DIAMETER OF A SINGLE CRYSTAL AND SINGLE CRYSTAL PULLING APPARATUS

(75) Inventors: Takahiro Yanagimachi, Nishishirakawa (JP); Susumu Sonokawa, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 435 days.

(21) Appl. No.: 12/452,492

(22) PCT Filed: Jul. 30, 2008

(86) PCT No.: PCT/JP2008/002038
§ 371 (c)(1),
(2), (4) Date: Jan. 5, 2010

(87) PCT Pub. No.: WO2009/028134
PCT Pub. Date: Mar. 5, 2009

(65) Prior Publication Data
US 2010/0128253 A1    May 27, 2010

(30) Foreign Application Priority Data
Aug. 31, 2007  (JP) ................. 2007-225679

(51) Int. Cl.
*G01N 21/00* (2006.01)
(52) U.S. Cl.
USPC .......................................... 356/30
(58) Field of Classification Search ............... 356/30–31
See application file for complete search history.

(56) References Cited

U.S. PATENT DOCUMENTS
5,763,838 A * 6/1998 Morimura et al. ......... 177/25.13
5,879,451 A   3/1999 Mizuishi

FOREIGN PATENT DOCUMENTS

| JP | A-61-286296 | 12/1986 |
|---|---|---|
| JP | A-2-64089 | 3/1990 |
| JP | A-9-175893 | 7/1997 |
| JP | A-2003-176199 | 6/2003 |
| JP | A-2004-35352 | 2/2004 |
| JP | A-2004-345907 | 12/2004 |

OTHER PUBLICATIONS

Sep. 15, 2011 Office Action issued in Chinese Patent Application 200880102139.X (with partial translation).
International Search Report for International Application No. PCT/JP2008/002038, issued Sep. 2, 2008.
Notification of Reasons for Refusal dated Jun. 26, 2012 from Japanese Patent Application No. 2007-225679 (with partial translation).

* cited by examiner

*Primary Examiner* — Tara S Pajoohi Gomez
(74) *Attorney, Agent, or Firm* — Oliff & Berridge, PLC

(57) ABSTRACT

The invention is a method for detecting the diameter of a single crystal grown by the Czochralski method, wherein the diameter of a single crystal is detected by both a camera and a load cell, the diameter detected by the camera is corrected based on a difference between the diameter detected by the camera and the diameter calculated by the load cell and a correction coefficient α obtained in advance according to a growth rate of the single crystal, and a value obtained by the correction is set as the diameter of the single crystal, and a single crystal pulling apparatus including both a camera and a load cell for detecting the diameter of a single crystal to be pulled upwardly. As a result, it is possible to improve the measurement accuracy of the diameter of a large-diameter, heavy crystal and achieve the enhancement of yields and a reduction in variations in quality.

16 Claims, 7 Drawing Sheets

METHOD FOR DETECTING THE DIAMETER OF A SINGLE CRYSTAL AND SINGLE CRYSTAL PULLING APPARATUS

TECHNICAL FIELD

The present invention relates to a method for detecting the diameter of a single crystal grown by the Czochralski method and a single crystal pulling apparatus.

BACKGROUND ART

As a semiconductor silicon single-crystal growth method, the Czochralski method (hereinafter, the CZ method) is known. In this method, a seed crystal is immersed in a melt and is slowly pulled upwardly while being rotated, whereby a single crystal is grown. The single crystal is produced so as to have a certain diameter. For example, when a finished product is an 8 inch (200 mm) wafer, it is common to produce a crystal having a diameter of 200 to 210 mm, which is slightly greater than the diameter of the wafer. Then, the crystal is ground at the outer circumference thereof so as to have a cylindrical shape, and is sliced into wafers. The wafer is then subjected to chamfering, and has an ultimate target wafer diameter. The target diameter in the production of a single crystal has to be greater than the wafer diameter of a finished product. However, too large a diameter increases grinding/polishing stock removal, making it uneconomical. Therefore, there is a demand for a single crystal having a diameter, which is greater than that of a wafer and is as small as possible.

In the CZ method, there are mainly two methods for controlling a diameter, of which one is an optical method (a camera method) and the other is a weight method (a load cell method). In the optical method, a growing crystal in a furnace is observed through quartz glass by a camera attached outside the furnace. The position of the edge of the crystal is determined by processing an image taken by the camera, and the position thus determined is converted into a diameter by turning the position into coordinates. Moreover, the optical methods include a method for measuring the ends of a crystal, a method for measuring one side of a crystal, a method for determining a diameter based on the curvature of a circular arc, and the like.

However, with the method for measuring the ends of a crystal by a camera, it becomes difficult to capture a diameter D shown in FIG. 1 in its entirety as the diameter of the crystal increases. Moreover, the problem is that, even when the diameter is captured in its entirety, degradation in resolution occurs. Furthermore, as disclosed in JP-A-2004-35352, for example, there is a method by which two cameras are provided in a pulling apparatus and the ends are observed by using these cameras. However, in this case, an error caused by displacement of the relative positions of the cameras becomes a problem.

Moreover, as a method for measuring one side of a crystal, there is a method for determining a diameter based on a distance R from a virtual center point as shown in FIG. 2. However, a measurement error occurs due to displacement of the virtual point caused by displacement of the position of a camera.

Furthermore, the optical methods include a method for determining a diameter by calculating a distance R from a center point based on the curvature of a circular arc as shown in FIG. 3. However, the problem of this method is that the curvature becomes small as the diameter of a crystal increases, resulting in an increase in measurement error.

As described above, the problem of the single crystal diameter detection method using the optical method is that a measurement error occurs due to an increase in diameter of a crystal or displacement of a camera for detection. For example, when the crystal diameter deviates from a target, a problem arises, such as a reduction in yields due to product failure caused by an insufficient diameter and an increase in grinding stock removal caused by too large a diameter. Moreover, quality equalization is achieved by changing the crystal growth conditions in a crystal growth direction. However, the problem is that, when the diameter of a crystal deviates from a target, the amount of silicon melt in a crucible deviates from a target, causing a difference in quality.

On the other hand, in the weight method, it is common to adopt a method (a load cell method) as disclosed, for example, in JP-A-9-175893, the method for measuring the weight of a growing crystal by attaching a weighing machine called a load cell to an arm shaft. The load cell method is a method for calculating the diameter of a crystal based on the increment of weight per unit length. This method does not suffer an error, which would occur in the optical method, and, if an error of the load cell alone is kept track of, it is possible to measure a diameter. However, the maximum permissible weight of the load cell has to be set to a large value to cope with an increasing weight of a crystal, and this causes an increase in measurement error, or causes a reduction in sensitivity, making it impossible to calculate a diameter in a short time. When the diameter increases in a short time, the diameter has to be reduced to a target by increasing a crystal growth rate; however, the problem is that it is impossible to perform such control in a short time, resulting in production of a crystal having projections and depressions. Moreover, the problem is that, when the grown single crystal is a crystal having projections and depressions, variations in quality are exacerbated in these projections and depressions, or product failure is caused due to an insufficient diameter in a depression portion.

DISCLOSURE OF INVENTION

Therefore, to solve the above problems, an object of the present invention is to provide a method for detecting the diameter of a single crystal and a single crystal pulling apparatus, that can improve the measurement accuracy of the diameter of a large-diameter, heavy crystal and can achieve the enhancement of yields and a reduction in variations in quality.

To achieve the above object, the present invention is a method for detecting the diameter of a single crystal grown by the Czochralski method, wherein the diameter of a single crystal is detected by both a camera and a load cell, the diameter detected by the camera is corrected based on a difference between the diameter detected by the camera and the diameter calculated by the load cell and a correction coefficient α obtained in advance according to a growth rate of the single crystal, and a value obtained by the correction is set as the diameter of the single crystal.

As described above, when a single crystal is grown by the Czochralski method, by detecting the diameter of a single crystal by both the camera and the load cell, correcting the diameter detected by the camera based on a difference between the diameter detected by the camera and the diameter calculated by the load cell and a correction coefficient α obtained in advance according to a growth rate of the single crystal, and setting a value obtained by the correction as the diameter of the single crystal, it is possible to improve the measurement accuracy of the diameter of a large-diameter, heavy crystal and achieve the enhancement of yields and a reduction in variations in quality.

Moreover, it is preferable that the correction be performed by adding, to the diameter detected by the camera, a value obtained by multiplying the difference between the diameter detected by the camera and the diameter calculated by the load cell by the correction coefficient α or adding the correction coefficient α to the difference between the diameter detected by the camera and the diameter calculated by the load cell.

As described above, by correcting the diameter detected by the camera by adding, to the diameter detected by the camera, a value obtained by multiplying the difference between the diameter detected by the camera and the diameter calculated by the load cell by the correction coefficient α or adding the correction coefficient α to the difference between the diameter detected by the camera and the diameter calculated by the load cell, it is possible to improve the accuracy in absolute value of a diameter, improve the measurement accuracy of the diameter of a large-diameter, heavy crystal, and achieve the enhancement of yields and a reduction in variations in quality effectively.

Furthermore, it is preferable that the single crystal diameter detection method measure a diameter obtained when a straight body of the single crystal becomes 10 cm and more.

As described above, by measuring a diameter obtained when a straight body of the single crystal becomes 10 cm and more by the single crystal diameter detection method of the invention, it is possible to solve the conventional problem of lowering of the accuracy in absolute value of a detected diameter with an increase in length of a straight body, improve the measurement accuracy of the diameter of a large-diameter, heavy crystal, and achieve the enhancement of yields and a reduction in variations in quality more effectively.

In addition, it is preferable that the diameter calculated by the load cell be an average of diameters obtained based on single crystal weights in an average interval of a straight body of the single crystal, and a region of the average interval be set to 10 cm or more.

As described above, by calculating an average value of the diameters by the load cell based on single crystal weights in the average interval of the straight body of the single crystal, and setting a region of the average interval to be 10 cm or more, the accuracy of a diameter detected based on the load cell weight is increased, and the accuracy of correction of a diameter detected by the camera is increased. This makes it possible to improve the measurement accuracy of the diameter of a large-diameter, heavy crystal effectively, and achieve the enhancement of yields and a reduction in variations in quality.

Moreover, it is preferable that the diameter detection be performed at least once after a straight body of the single crystal becomes 10 cm.

As described above, by performing the diameter detection by the single crystal diameter detection method of the invention at least once after the straight body of the single crystal becomes 10 cm, it is possible to detect the diameter of the single crystal with an extremely high degree of accuracy, improve the measurement accuracy of the diameter of a large-diameter, heavy crystal more effectively, and achieve the enhancement of yields and a reduction in variations in quality.

Furthermore, the present invention provides a single crystal pulling apparatus for growing a single crystal by the Czochralski method, the single crystal pulling apparatus at least including both a camera and a load cell for detecting the diameter of a single crystal to be pulled upwardly.

As described above, when a single crystal pulling apparatus for growing a single crystal by the Czochralski method is a single crystal pulling apparatus including both a camera and a load cell for detecting the diameter of a single crystal to be pulled upwardly, it is possible to provide a single crystal pulling apparatus that can utilize the advantages of a camera method and a load cell method and make up for the disadvantages thereof, and can detect a single crystal diameter with a high degree of accuracy.

Moreover, it is preferable that the single crystal pulling apparatus be a single crystal pulling apparatus in which the diameter of a single crystal is detected by the single crystal diameter detection method of the invention.

As described above, in the single crystal pulling apparatus including both a camera and a load cell, by detecting the diameter of a single crystal by the single crystal diameter detection method of the invention, it is possible to utilize the advantages of a camera method and a load cell method and can make up for the disadvantages thereof, improve the measurement accuracy of the diameter of a large-diameter, heavy crystal more effectively, and achieve the enhancement of yields and a reduction in variations in quality.

According to the single crystal diameter detection method and the single crystal pulling apparatus of the invention, it is possible to provide a single crystal diameter detection method and a single crystal pulling apparatus that can improve the measurement accuracy of the diameter of a large-diameter, heavy crystal and can achieve the enhancement of yields and a reduction in variations in quality.

BEST MODE FOR CARRYING OUT THE INVENTION

Figure 1:
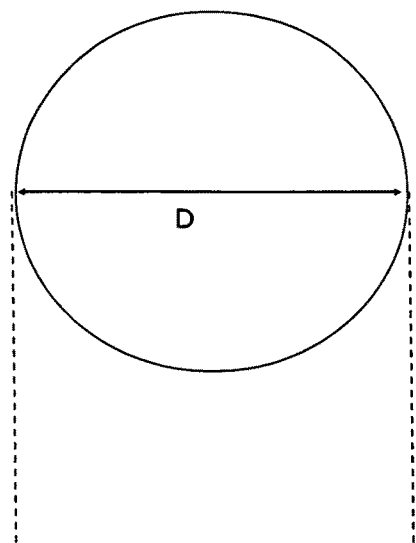
FIG. 1 is a diagram showing a method for measuring the ends of a crystal by a camera according to a conventional optical method.
Figure 2:
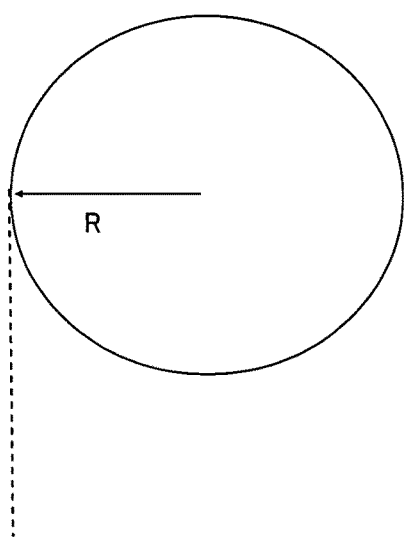
FIG. 2 is a diagram showing a method for measuring one side of a crystal by a camera according to a conventional optical method.
Figure 3:
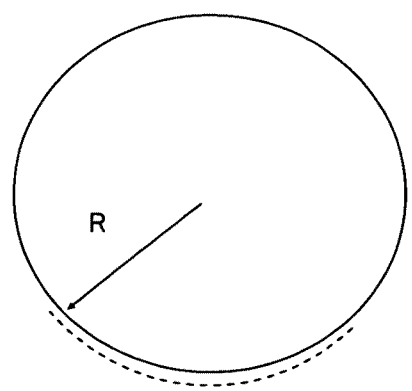
FIG. 3 is a diagram showing a method for determining a diameter based on the curvature of a circular arc according to a conventional optical method.

As described above, conventionally, there are mainly two methods for controlling a diameter, of which one is an optical method (a camera method) and the other is a weight method (a load cell method). However, as mentioned above, the problem of the optical method is that a measurement error occurs due to an increase in diameter of a crystal or displacement of a camera for detection. Also, the problem of the weight method (the load cell method) is that the maximum permissible weight of a load cell has to be set to a large value to cope with an increasing weight of a crystal, and this causes an increase in measurement error, or causes a reduction in sensitivity, making it impossible to calculate a diameter in a short time. When the diameter increases in a short time, it is impossible to perform control so as to reduce the diameter to a target in a short time by increasing a crystal growth rate (that is, due to a low sensitivity), resulting in production of a crystal having projections and depressions.

To solve the above problems, the inventor first studied characteristics (advantages and disadvantages) of the optical method (the camera method) and the weight method (the load cell method). The results are shown in a table below (Table 1).

TABLE 1

| Methods | Advantages | Disadvantages |
| --- | --- | --- |
| Optical method | This method is sensitive to a relative change, and is suitable for controlling short-time fluctuations. | This method is of low accuracy in absolute value. |
| Weigth method | This method is of high accuracy in absolute value. | This method suffers a reduction in sensitivity in production of a heavy crystal (because, in standards, the accuracy is usually oo % of max), and therefore it is difficult to control short-time fluctuations with this method. |

Table 1 reveals that, while the camera method (the optical method) is suitable for controlling short-time fluctuations in the single crystal diameter, this method is of low accuracy in absolute value of a detected diameter. On the other hand, while the weight method (the load cell method) is of high accuracy in absolute value, the disadvantage of this method is that, in production of a heavy crystal, due to a reduction in sensitivity, it is difficult to control short-time fluctuations in the single crystal diameter.

Therefore, as a result of intensive research, the inventor completed a single crystal diameter detection method and a single crystal pulling apparatus according to the invention by combining the camera method (the optical method) and the load cell method (the weight method), the single crystal diameter detection method and the single crystal pulling apparatus that can utilize the advantages of these methods and can make up for the disadvantages thereof, and achieved an improvement in the accuracy in absolute value of a detected single crystal diameter.

Hereinafter, an embodiment of the invention will be described specifically; however, the invention is not limited thereto.

Figure 4:
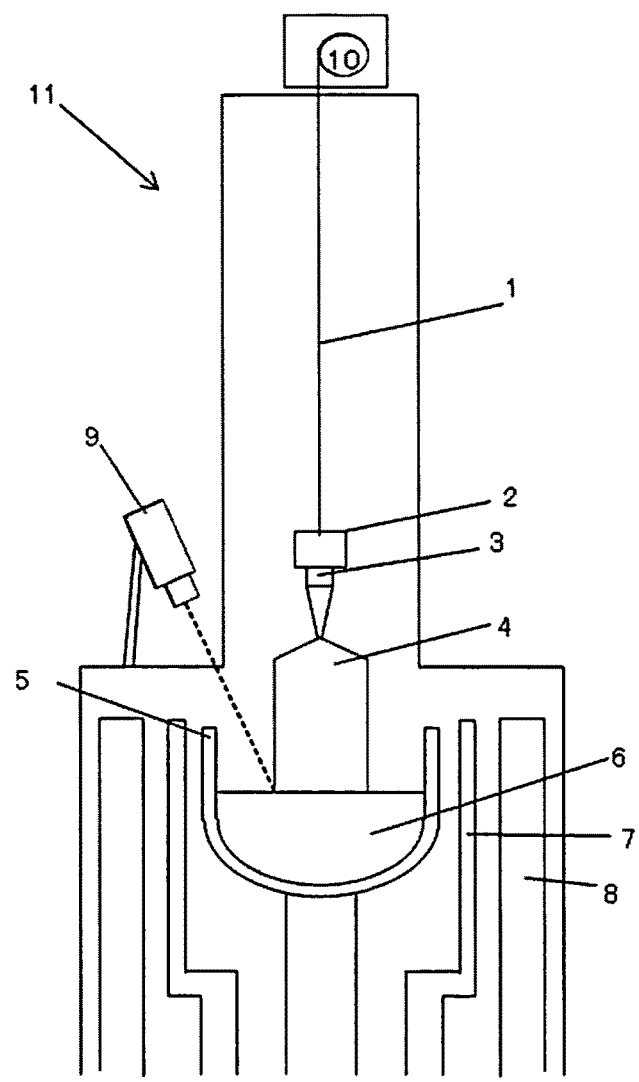
FIG. 4 is a schematic sectional view showing an example of a single crystal pulling apparatus according to the invention.

FIG. 4 is a schematic sectional view showing an example of the single crystal pulling apparatus according to the invention. In the single crystal pulling apparatus 11, a load cell (a weighing machine) 10 that can measure the weight of a single crystal 4 when the single crystal 4 is grown by immersing, in a melt 6 in a crucible 5, a seed crystal 3 held by a seed chuck 2 at a lower end of a wire 1, and then pulling the seed crystal upwardly is provided at an upper end of the wire 1, and a camera 9 for detection of a diameter that can observe the inside of a furnace through quartz glass, is additionally provided outside the furnace. Moreover, when the single crystal is grown, a heat insulating member 8 is provided outside a heater 7 to protect a chamber.

It is possible to calculate the diameter of a single crystal based on the increment of weight per unit length, the weight of the single crystal 4 measured by the load cell 10. Moreover, the camera 9 for detection of a diameter can detect the diameter of the single crystal 4 by determining the position of the end of the single crystal 4 by processing an image in the furnace, the image taken by the camera, and turning the position into coordinates.

Figure 5:
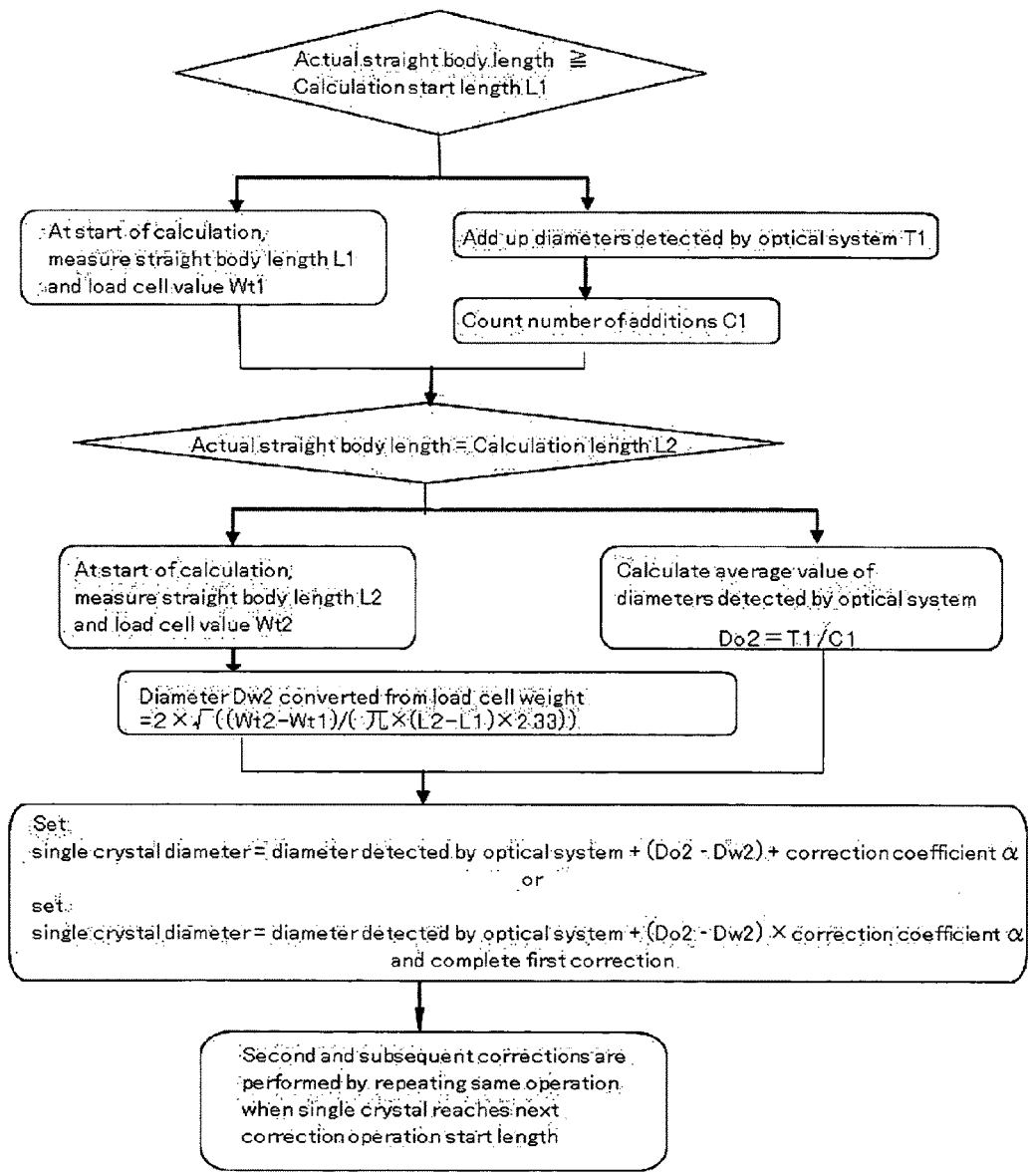
FIG. 5 is a diagram showing a flow of a single crystal diameter detection method of the invention.

Next, the single crystal diameter detection method according to the invention will be described. FIG. 5 is a diagram showing a flow of the single crystal diameter detection method of the invention. When a single crystal straight body is L1 in length, calculation is started, and the weight Wt1 of the single crystal is measured by the load cell. The single crystal is pulled upwardly until the straight body becomes L2 in length, and the weight Wt2 of the single crystal is measured again by the load cell. Next, based on the weights Wt1 and Wt2 of the single crystal measured by the load cell, the average diameter Dw in the average interval from L1 to L2 is calculated. At this time, the formula for calculating the diameter Dw converted from the load cell weight is as follows: $Dw = 2 \times \sqrt{((Wt2-Wt1)/(\pi \times (L2-L1) \times 2.33))}$ (2.33: the specific gravity of a silicon single crystal).

On the other hand, in parallel with the measurement of the weight of the single crystal by the load cell, a diameter is detected by the camera several times between L1 and L2. The diameters thus obtained are added up, whereby a cumulative total value T1 is calculated. Moreover, at this time, the number of additions is counted, and the calculated cumulative total value T1 is divided by the number C1 of additions thus counted, whereby a diameter Do detected by the camera is calculated.

Next, correction of the diameter detected by the camera is performed. Specifically, a difference between Do which is the diameter detected by the camera and the diameter Dw calculated by the load cell is obtained, and a value obtained by multiplying the difference by a correction coefficient α or obtained by adding the correction coefficient α to the difference is added to the diameter detected by the camera. After this correction is completed, the single crystal is pulled upwardly by controlling the diameter so as to be a value obtained by the correction. Moreover, the second and subsequent corrections are performed by repeating the same operation when the single crystal reaches the next correction operation start length.

Incidentally, the correction coefficient α is a numerical value, which is obtained in advance according to a growth rate of a single crystal. The load cell weight is a weight that can be measured when a crystal is hung in resting state. However, at the time of actual production of a crystal, there is a discrepancy between a diameter converted from the weight obtained by the load cell and an actual diameter due to the shape of a crystal growth interface, the presence of surface tension, or the like. That is, as indicated by an arrow in FIG. 6, if the same production method is used, the higher a crystal growth rate, the more noticeable the convex shape of a growth interface becomes. Although this error can be determined by producing an actual crystal and measuring the error for each pulling apparatus, a discrepancy between a diameter converted from the weight and an actual diameter can be forecast to some extent if the convex shape can be predicted. Therefore, it becomes necessary to obtain the relationship between a growth rate and a correction coefficient in advance for each pulling apparatus and perform the above-described correction by using the obtained correction coefficient $\alpha$.

Figure 6:
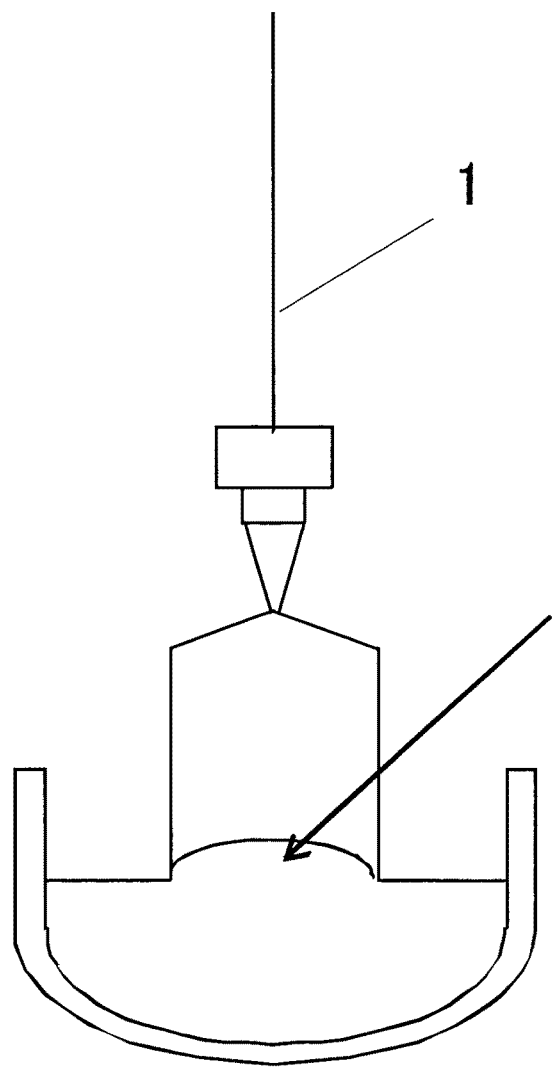
FIG. 6 is an example of the shape of a crystal growth interface.

Moreover, as shown in FIG. 6, if a production condition, such as an apparatus, goes through a change that causes a change in the shape of a growth interface, the gradient of the relationship between a growth rate and a correction coefficient also changes. Therefore, the above relationship has to be obtained for each production condition. On the other hand, since the relationship between a growth rate and a correction coefficient does not change unless the production condition changes, there is no need to perform an experiment again as long as the relationship is obtained before production of a product. A specific method for obtaining a correction coefficient is as follows. A diagram (for example, FIG. 11) showing the correlation between an average diameter of the actual diameters and a diameter calculated by the load cell is created by actually growing a crystal, and a correlation line is then drawn, whereby a correction coefficient of the pulling rate at that time can be obtained. At this time, a correction coefficient can be obtained accurately by producing at least three or more single crystals. In this case, by performing a method by which an intercept is obtained by setting the gradient to 1, the correction coefficient thus obtained is a correction coefficient to be added in the invention; by performing a method by which a gradient is obtained by setting the intercept to zero, the correction coefficient thus obtained is a correction coefficient to be multiplied. Correction using a higher correlation coefficient will suffice, and there is no need to use both addition and multiplication in a limited interval.

Figure 7:
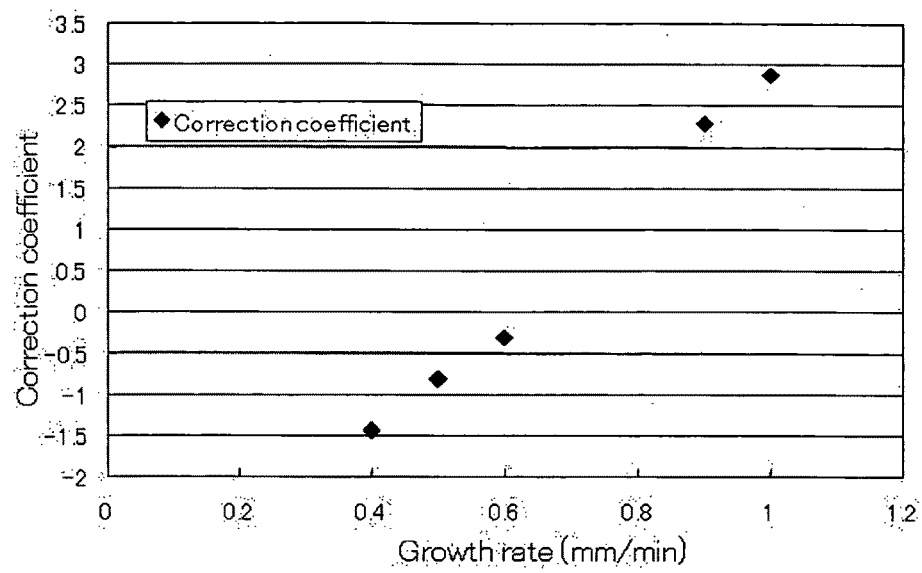
FIG. 7 is a graph showing the relationship between a growth rate and a correction coefficient in a single crystal pulling apparatus used in Examples.
Figure 11:
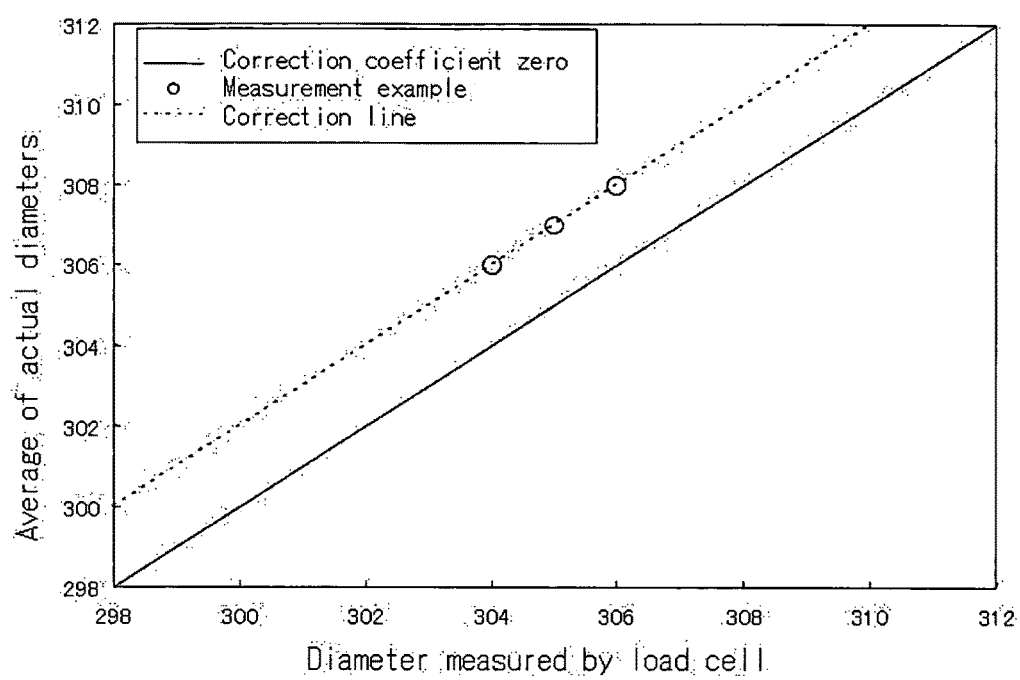
FIG. 11 is a graph showing an example of a diagram showing the correlation between an average diameter of actual diameters and a diameter calculated by a load cell.

Moreover, by obtaining a correction coefficient at a minimum of two types of pulling rate, a graph shown in FIG. 7, for example, is obtained. FIG. 7 shows correction coefficients to be added, the correlation coefficients obtained at these pulling rates by creating a diagram showing the correlation between an average diameter of the actual diameters and a diameter calculated by the load cell, as shown in FIG. 11, by actually growing a crystal, and then drawing a correlation line. When correction is performed at an unknown pulling rate, it is best to obtain a new correction coefficient by the above-described method. However, a value estimated from FIG. 7 obtained by this method can adequately fulfill a function. At this time, if the two types of pulling rates are MAX and MIN of use conditions, correction can be performed more accurately.

Furthermore, since L1 and L2 described above are lengths of the actual single crystal, when, for example, a pulling apparatus having a structure in which a crystal position is calculated based on a pulling distance of the wire 1 from which the crystal is hung is adopted, correction for the amount by which the wire 1 stretches has to be performed concurrently with the above-described correction.

Incidentally, a single crystal to be produced may be a silicon single crystal, for example; however, a single crystal to be produced is not limited to this specific type, and may be any other semiconductor single crystal or the like.

Moreover, it is preferable that a diameter detected by the single crystal diameter detection method according to the invention be a diameter obtained when a straight body of the single crystal becomes 10 cm and more. A diameter obtained before the straight body of the single crystal becomes 10 cm can be detected only by the camera method suitable for short-time diameter control. However, as previously explained, by the camera method alone, the longer the straight body becomes, the lower the accuracy in absolute value becomes due to displacement of the relative positions of the cameras or an increase in diameter of a crystal. Therefore, the present invention is particularly effective in detecting the diameter of a single crystal when the straight body thereof becomes 10 cm and more.

Furthermore, it is preferable that a region of the average interval from L1 to L2 described above be set to 10 cm or more. This is because the longer the interval in which diameter correction is calculated, the higher the accuracy of a diameter detected by the load cell weight. This makes it possible to perform more accurate correction.

In addition, it is preferable that the above correction be performed at least once after the straight body of the single crystal becomes 10 cm. It is true that, even when the above correction is performed only once after the straight body becomes 10 cm, the diameter accuracy can be improved satisfactorily. However, by performing the above correction repeatedly with the progress of the growth of a crystal, it is possible to detect a diameter with an extremely high degree of accuracy.

Moreover, it is preferable that the single crystal diameter detection method according to the invention be performed in the single crystal pulling apparatus according to the invention, the single crystal pulling apparatus including both a camera and a load cell that are provided for detecting the diameter of a single crystal to be pulled upwardly. By combining the camera method (the optical method) and the load cell method (the weight method), it is possible to utilize the advantages of these methods and make up for the disadvantages thereof.

Hereinafter, the invention will be described more specifically with examples of the invention; however, the invention is not limited to these examples.

Example 1

A single crystal was produced by using the single crystal pulling apparatus of FIG. 4, performing correction of a diameter detected by the camera by a method according to the flow shown in FIG. 5, and controlling the diameter so as to be a value obtained by the correction. Before production of the single crystal, a relationship between a growth rate and a correction coefficient in a single crystal pulling apparatus to be actually used was obtained in advance (FIG. 7). By setting the length L1 of a straight body at the start of calculation to 5 cm and setting the length L2 of the straight body to 15 cm, a diameter Do detected by the camera between 5 cm and 15 cm and a diameter Dw determined based on the amount of change in weight between 5 cm and 15 cm were detected. After the straight body became 15 cm, correction of the diameter detected by the camera was performed by adding, to the diameter detected by the camera, a value obtained by adding a correction coefficient −1.5 corresponding to an actual pulling rate 0.4 mm/min to a difference (Do−Dw) between the diameter detected by the camera and the diameter calculated by the load cell, and the diameter of the single crystal was controlled so as to be a value obtained by the correction, whereby the single crystal was produced. The diameter after production of the crystal was measured in a 40 cm part of the straight body, and diameter variation (standard deviation $\sigma$) was evaluated.

Example 2

A single crystal was produced by using the same single crystal pulling apparatus as that used in Example 1 by a method similar to that in Example 1, except that the length L1 of a straight body at the start of calculation was set to 5 cm, the length L2 of the straight body was set to 25 cm, and the average interval in which correction was calculated was set to 20 cm, by performing correction of a diameter detected by the camera by adding, to the diameter detected by the camera, a value obtained by addition of a correction coefficient −1.5 corresponding to an actual pulling rate 0.4 mm/min, and controlling the diameter of a single crystal so as to be a value obtained by the correction. As in Example 1, the diameter after production of the crystal was measured in a 40 cm part of the straight body, and diameter variation (standard deviation σ) was evaluated.

Comparative Example

A crystal was produced by a conventional method in which the position of the edge of a crystal was observed by a camera and a diameter was detected based on a distance from a virtual center point in a single crystal pulling apparatus having the same structure as that of the single crystal pulling apparatus of FIG. 4, except that the load cell 10 was not provided. As in Examples 1 and 2, the diameter after production of the crystal was measured in a 40 cm part of the straight body, and diameter variation (standard deviation σ) was evaluated.

Incidentally, in all of the above-described Examples 1 and 2 and Comparative Example, a crucible was 32 inches (800 mm) in size, 300 kg of silicon raw material was charged therein, and a 12 inch (308 mm) single crystal was produced.

Table 2 shows the diameter variation (standard deviation σ) obtained in a 40 cm part of a single crystal straight body and evaluated in Examples 1 and 2 and Comparative Example. In Comparative Example, the diameter variation (standard deviation σ) was 1.2 mm. On the other hand, in Example 1 (L2−L1=10 cm), the diameter variation (standard deviation σ) was 0.7 mm, and, in Example 2 (L2−L1=20 cm), the diameter variation (standard deviation σ) was 0.6 mm.

TABLE 2

| | Comparative Example (conventional) | Example 1 | Example 2 |
|---|---|---|---|
| Diameter variation (standard deviation σ) | 1.2 mm | 0.7 mm | 0.6 mm |

Figure 8:
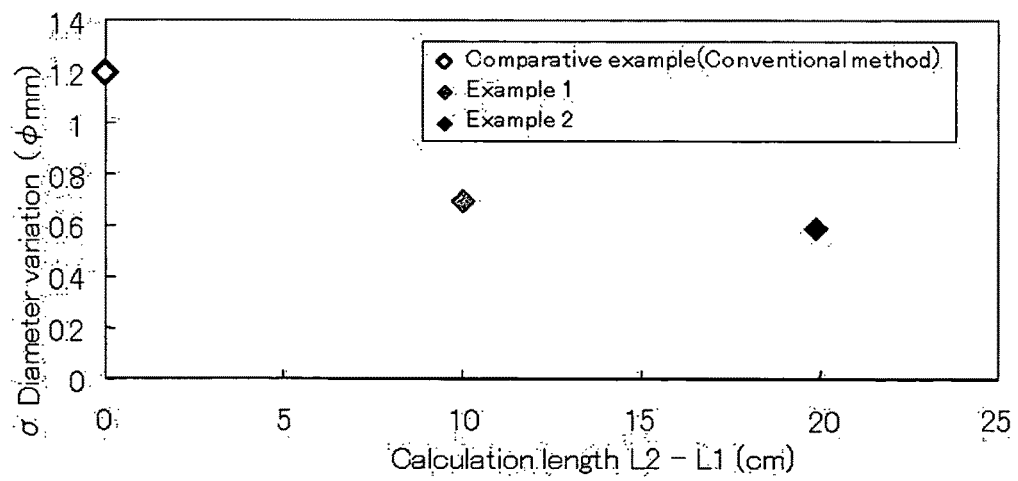
FIG. 8 is a plot showing diameter variation (standard deviation σ) in a 40 cm part of a single crystal straight body, the diameter variation (standard deviation σ) evaluated in Examples 1 and 2 and Comparative Example.
Figure 9:
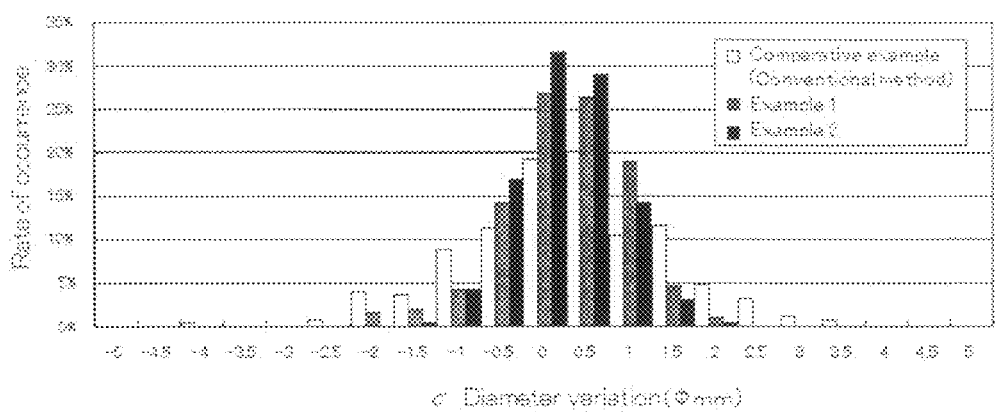
FIG. 9 is a graph showing a histogram of diameter variation (standard deviation σ) in a 40 cm part of a single crystal straight body, the diameter variation (standard deviation σ) evaluated in Examples 1 and 2 and Comparative Example.

FIG. 8 is a plot of diameter variation (standard deviation σ) in a 40 cm part of a single crystal straight body, the diameter variation (standard deviation σ) evaluated in Examples 1 and 2 and Comparative Example. Moreover, FIG. 9 is a graph showing a histogram of diameter variation (standard deviation σ) in a 40 cm part of a single crystal straight body, the diameter variation (standard deviation σ) evaluated in Examples 1 and 2 and Comparative Example. It is clear from FIGS. 8 and 9 that the longer the interval (from L1 to L2) in which diameter correction is calculated, the higher the diameter accuracy.

Example 3

A single crystal was produced by using the same single crystal pulling apparatus as that in Example 1, setting the average interval (L2−L1) in which correction was calculated to 5 cm, 10 cm, 15 cm, and 20 cm, and controlling the diameter of a single crystal by a method similar to that in Example 1, and a diameter calculation error of the load cell in a 40 cm part of a straight body was examined. The results revealed that an actual error in the weights repeatedly measured by the load cell was 100 g in any of the 5 cm to 20 cm average intervals (L2−L1), and a diameter conversion error in an interval of 10 cm or more was approximately 1 mm or less.

Figure 10:
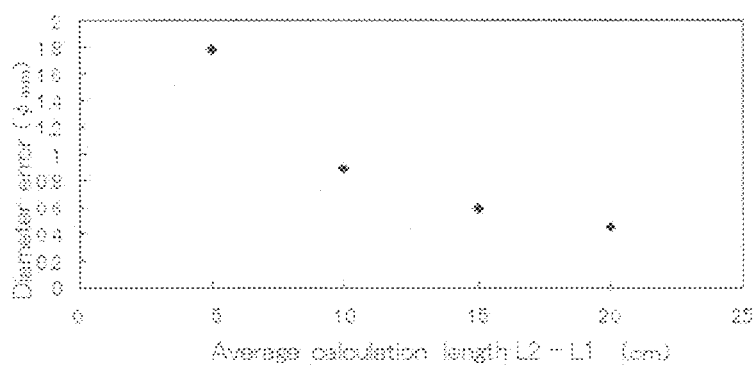
FIG. 10 is a graph showing the relationship between the average interval (L2−L1) in which correction is calculated and a diameter calculation error of a load cell, the relationship observed in Example 3.

FIG. 10 is a graph showing the relationship between the average interval (L2−L1) in which correction is calculated and a diameter calculation error of a load cell, the relationship observed in Example 3. It is clear from FIG. 10 that there is not a great difference between the 10 cm average interval (L2−L1) and the 20 cm average interval (L2−L1). The reason is considered to be as follows. The longer the average interval in which correction is calculated, the higher the accuracy of diameter detection performed by the load cell. On the other hand, however, a delay develops in correction timing. This makes it difficult to produce the effects of the invention.

Therefore, performing correction in a short interval by using an accurate load cell is most effective. However, it has been found out that, as far as the load cell used in all examples is concerned, a significant effect cannot be expected even when the average interval in which correction is calculated is set to an interval longer than 10 cm, and an adequate effect can be obtained by using an average in a 10 cm interval. However, this effective interval can be further shortened if an improvement of the accuracy of the load cell is made possible.

It is to be understood that the present invention is not limited in any way by the embodiment thereof described above. The above embodiment is an example, and anything that has substantially the same structure as the technical idea recited in the claims of the present invention and that offers similar benefits falls within the technical scope of the present invention.

For example, the above descriptions deal with cases in which correction of the diameter detected by the camera is performed by adding, to the diameter detected by the camera, a value obtained by adding a correction coefficient corresponding to an actual pulling rate to a difference between the diameter detected by the camera and the diameter calculated by the load cell. However, the accuracy of the detected diameter of a single crystal is improved even by performing the correction by adding, to the diameter detected by the camera, a value obtained by multiplying a difference between the diameter detected by the camera and the diameter calculated by the load cell by the correction coefficient α, and the same effects can be obtained.

The invention claimed is:

1. A method for detecting a diameter of a single crystal grown by Czochralski method, wherein
   a diameter of a single crystal is detected by a load cell and, in parallel with the detection by the load cell, a camera, the diameter detected by the camera is corrected based on a difference between the diameter detected by the camera and the diameter calculated by the load cell and a correction coefficient α obtained in advance according to a growth rate of the single crystal, and a value obtained by the correction is set as the diameter of the single crystal.

2. The method for detecting a single crystal diameter according to claim 1, wherein
   the correction is performed by adding, to the diameter detected by the camera, a value obtained by multiplying the difference between the diameter detected by the camera and the diameter calculated by the load cell by the correction coefficient α or adding the correction coefficient α to the difference between the diameter detected by the camera and the diameter calculated by the load cell.

3. The method for detecting a single crystal diameter according to claim 2, wherein
the method for detecting a single crystal diameter measures a diameter obtained when a straight body of the single crystal becomes 10 cm and more.

4. The method for detecting a single crystal diameter according to claim 3, wherein
the diameter calculated by the load cell is an average of diameters obtained based on single crystal weights in an average interval of a straight body of the single crystal, and a region of the average interval is set to 10 cm or more.

5. The method for detecting a single crystal diameter, wherein
diameter detection according to claim 4 is performed at least once after a straight body of the single crystal becomes 10 cm.

6. The method for detecting a single crystal diameter, wherein
diameter detection according to claim 3 is performed at least once after a straight body of the single crystal becomes 10 cm.

7. The method for detecting a single crystal diameter according to claim 2, wherein
the diameter calculated by the load cell is an average of diameters obtained based on single crystal weights in an average interval of a straight body of the single crystal, and a region of the average interval is set to 10 cm or more.

8. The method for detecting a single crystal diameter, wherein
diameter detection according to claim 7 is performed at least once after a straight body of the single crystal becomes 10 cm.

9. The method for detecting a single crystal diameter, wherein
diameter detection according to claim 2 is performed at least once after a straight body of the single crystal becomes 10 cm.

10. The method for detecting a single crystal diameter according to claim 1, wherein
the method for detecting a single crystal diameter measures a diameter obtained when a straight body of the single crystal becomes 10 cm and more.

11. The method for detecting a single crystal diameter according to claim 10, wherein
the diameter calculated by the load cell is an average of diameters obtained based on single crystal weights in an average interval of a straight body of the single crystal, and a region of the average interval is set to 10 cm or more.

12. The method for detecting a single crystal diameter, wherein
diameter detection according to claim 11 is performed at least once after a straight body of the single crystal becomes 10 cm.

13. The method for detecting a single crystal diameter, wherein
diameter detection according to claim 10 is performed at least once after a straight body of the single crystal becomes 10 cm.

14. The method for detecting a single crystal diameter according to claim 1, wherein
the diameter calculated by the load cell is an average of diameters obtained based on single crystal weights in an average interval of a straight body of the single crystal, and a region of the average interval is set to 10 cm or more.

15. The method for detecting a single crystal diameter, wherein
diameter detection according to claim 14 is performed at least once after a straight body of the single crystal becomes 10 cm.

16. The method for detecting a single crystal diameter, wherein
diameter detection according to claim 1 is performed at least once after a straight body of the single crystal becomes 10 cm.

* * * * *